United States Patent [19]

Slavin et al.

[11] Patent Number: 5,654,762
[45] Date of Patent: Aug. 5, 1997

[54] BLOCK MATCHING FOR PICTURE MOTION ESTIMATION USING GRAY CODES

[75] Inventors: Keith R. Slavin, Aloha; Shane Ching-Feng Hu, Beaverton, both of Oreg.

[73] Assignee: Tektronix, Inc., Wilsonville, Oreg.

[21] Appl. No.: 432,350

[22] Filed: May 1, 1995

[51] Int. Cl.$^6$ .................................................. H04N 7/18
[52] U.S. Cl. .................... 348/420; 348/416; 348/415; 348/411; 348/699; 382/16
[58] Field of Search .............................. 348/420, 384, 348/411, 416, 699, 700, 701, 415, 409, 405, 404; 382/16, 1

[56] References Cited

U.S. PATENT DOCUMENTS

| | | | |
|---|---|---|---|
| 4,409,623 | 10/1983 | Kobayashi et al. | 358/261 |
| 4,533,957 | 8/1985 | Iinuma | 358/261 |
| 4,652,935 | 3/1987 | Endoh et al. | 358/200 |
| 4,788,598 | 11/1988 | Ochi et al. | 358/260 |
| 4,894,713 | 1/1990 | Delogne et al. | 358/133 |
| 4,918,739 | 4/1990 | Lorente et al. | 382/16 |
| 5,043,807 | 8/1991 | Rabii | 358/36 |
| 5,142,590 | 8/1992 | Carpenter et al. | 382/14 |
| 5,301,284 | 4/1994 | Estes et al. | 395/400 |
| 5,442,458 | 8/1995 | Rabbani et al. | 358/261 |

OTHER PUBLICATIONS

"Subband Image Coding" by Editor John W. Woods, The Kluwer International Series in Engineering and Computer Science.

*Primary Examiner*—Tommy P. Chin
*Assistant Examiner*—Anand S. Rao
*Attorney, Agent, or Firm*—Francis I. Gray

[57] ABSTRACT

Block matching for picture motion estimation uses Gray codes, and preferably a new Hamming-2 Gray code where the bit pattern changes by only one bit for each step in the Gray code count sequence with the additional condition that all other codes are at least two bits different if not adjacent in the count sequence. The pixels for a reference block from a first picture frame and the pixels for a corresponding block within a search area of the next picture frame are each quantized and then converted to an appropriate Gray code. The Gray codes for corresponding pixels are compared to determine whether they are equal or adjacent to each other. If there is adjacency or equality a match signal is generated for that pixel which is tallied. The total tally for each reference block position within the search area is determined, with the maximum tally indicating a match between blocks from which picture motion estimation may be determined.

6 Claims, 2 Drawing Sheets

FIG.2

$x_6=0=$ EQUALITY
$x_6=1=$ NON-EQUALITY $y_6=0$ MATCH
$y_6=1$ NO-MATCH

BLOCK MATCHING FOR PICTURE MOTION ESTIMATION USING GRAY CODES

BACKGROUND OF THE INVENTION

The present invention relates to moving pictures, and more particularly to block matching for picture motion estimation using Gray codes which provides a more hardware efficient technique for finding the "best fit" between a reference block in one picture frame and a corresponding block in a search area of the next picture frame.

A single monochrome digital video picture frame usually contains a set of sample values describing the luminance values at regular intervals vertically and horizontally within the picture frame. In a sequence of such picture frames any motion between each frame, due to camera panning or zooming, objects moving in the picture, etc., means that a pixel or group of pixels representing an object in one picture frame may have a corresponding set of pixels in the portrayal of the same object in the next picture frame of the sequence at a difference position within the frame.

Block matching is used to decide where a sampled block of pixels in one picture frame matches most closely to a block of pixels in the next picture frame. What is desired is an estimate of the motion for each block in one picture frame by obtaining the new position of the corresponding block, if it exists, in the next picture frame. With a limited amount of motion between frames, the search radius may be reduced and, therefore, the amount of computation required.

What is needed is a technique for obtaining a "best fit" between a reference block of one picture frame and a corresponding block in a search area of a next picture frame with a minimum amount of hardware.

SUMMARY OF THE INVENTION

Accordingly the present invention provides block matching for picture motion estimation using Gray codes to find the "best fit" between a reference block of pixels in one picture frame and a corresponding block of pixels in a search area of the next picture frame. The pixels of the reference and corresponding search block are quantized and each converted into a Gray code, preferably a Hamming-2 Gray code which has the characteristic that each code in sequence differs from an adjacent code by one bit and differs from all other codes by at least two bits. The corresponding quantized pixel pairs from the reference and corresponding blocks are compared to determine whether there is equality or adjacency. If there is equality or adjacency, a tally is incremented for the current reference block position within the search area. After all the quantized pixels for the reference block are processed, the reference block position within the search area is changed and the pixel matching repeated until all positions of the reference block within the search area have been tallied. The "best fit" block is the position of the reference block within the search area that yields the highest tally.

The objects, advantages and other novel features of the present invention are apparent from the following detailed description when read in conjunction with the appended claims and attached drawing.

DESCRIPTION OF THE PREFERRED EMBODIMENT

Figure 1:
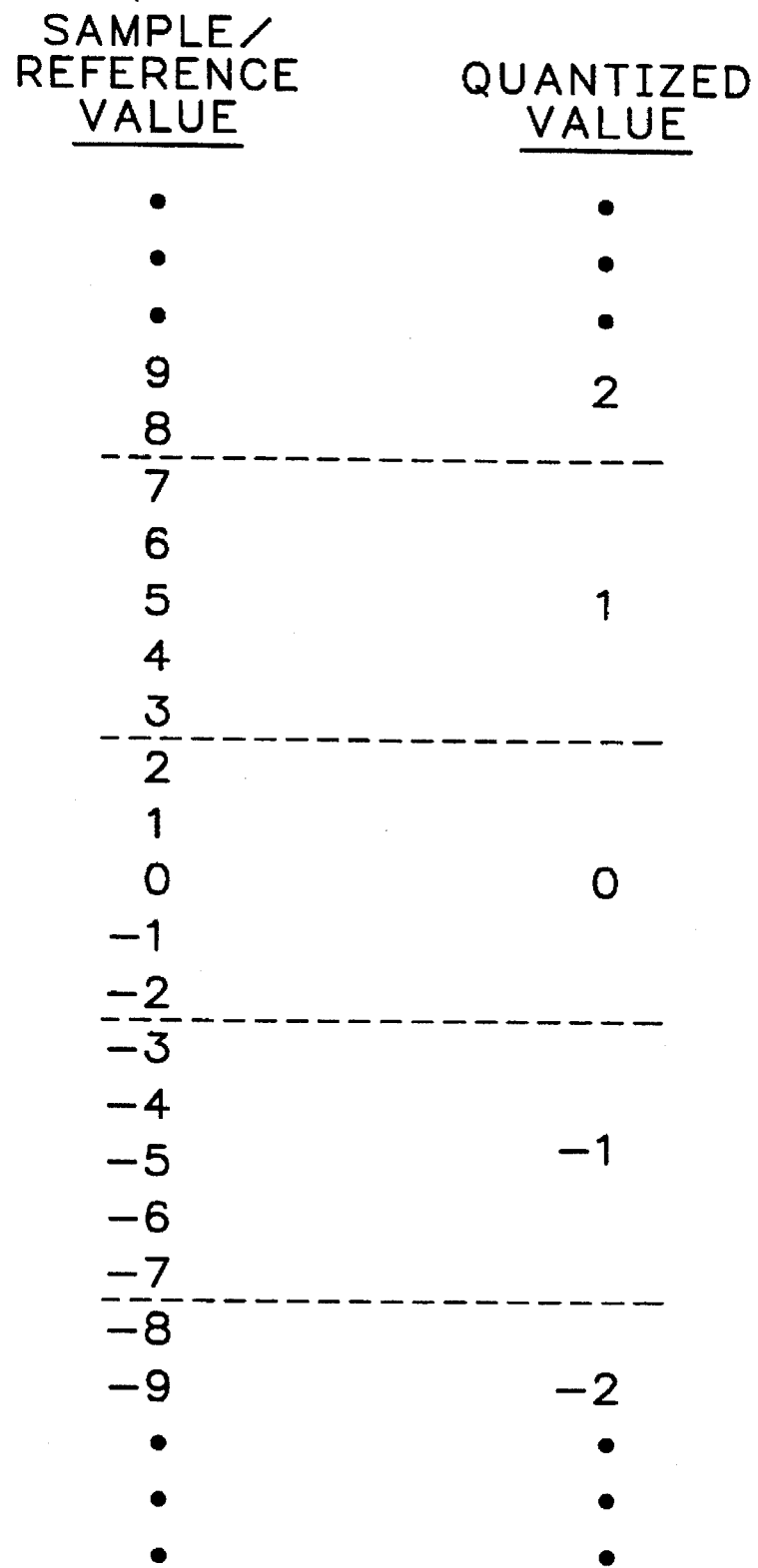
FIG. 1 is an illustration of quantization of pixels according to the present invention.

In block matching a reference block from a first frame is compared with every possible corresponding block within a larger search area in a second frame. Each pixel within the reference block and the corresponding block within the search area is quantized, corresponding pixels between the two blocks are compared, and a tally is kept of the number of pairs of quantized pixels that differ by one or less. The position of the reference block within the search area with the highest tally value identifies the new position of the portion of the picture represented by the reference block in the second frame. From the new position motion estimation may be determined.

The first step in determining the "best fit" tally is to quantize each pixel of the reference and the corresponding block of the search area to the nearest integer based on the threshold T as:

$$S = RoundToNearest(Pixel/T) \qquad (1)$$

The next step is to convert the quantized pixels to m-bit Gray code which has the property that the bit pattern only changes by one for each step in a Gray-code count sequence. An example for an m=4-bit code is given in Table I below:

TABLE I

| Decimal | 2's Complement Binary | Gray |
|---|---|---|
| 7 | 0111 | 0100 |
| 6 | 0110 | 0101 |
| 5 | 0101 | 0111 |
| 4 | 0100 | 0110 |
| 3 | 0011 | 0010 |
| 2 | 0010 | 0011 |
| 1 | 0001 | 0001 |
| 0 | 0000 | 0000 |
| −1 | 1111 | 1000 |
| −2 | 1110 | 1001 |
| −3 | 1101 | 1011 |
| −4 | 1100 | 1010 |
| −5 | 1011 | 1110 |
| −6 | 1010 | 1111 |
| −7 | 1001 | 1101 |
| −8 | 1000 | 1100 |

So for a single reference pixel Pref:

$$G_{ref} = BinaryToGray(RoundToNearest(P_{ref}/T)) \qquad (2)$$

A match between a reference pixel and the corresponding search pixel is expressed as:

$$-T =< (P_{ref} - P_{search}) < T \qquad (3)$$

which, when normalized by dividing by T, becomes:

$$-1 =< (P_{ref} - P_{search})/T < 1 \qquad (4)$$

Then using equation (1) an approximately equivalent quantized comparison is obtained:

$$-1 =< (S_{ref} - S_{search}) < 1 \qquad (5)$$

Analysis shows that the discrimination of the algorithm is fairly insensitive to the value of T, so that quantization before comparison produces good results.

For a given pixel pair, if equation (5) is complied with, then from the Gray code definition:

$$\text{NumberOfOnes}(Gref\char`\^ Gsearch) \le 1 \quad (6)$$

where "^" is a bit-wise exclusive OR operator. If equation (5) is not complied with, then the probability of a false match in Gray codes is given by the number of false matches over the total number of codes:

$$Pfalse = (m-2)/2**m \quad (7)$$

The number of false matches is m–2 because for any Gray code value, m Gray codes differ by 1 bit, and 2 codes are correctly adjacent. For good matching discrimination it is necessary to have a large enough threshold to give a large number of matches, and a small enough threshold to avoid too many false matches.

To avoid the problem of false matches a special Hamming-2 Gray code may be used. The property of this special Gray code is that the bit pattern only changes by one for each step in the Gray code, as is conventional, with the additional constraint that all codes are two or more bits different from any other code unless it is an adjacent code in the count sequence. The Hamming-2 Gray code is less densely packed than conventional Gray codes. It is generated by the following steps:

(a) Start at code 0 with an m=1-bit code;

(b) Generate each new code using the previous code in the sequence as a starting point; try inverting each bit from the starting point, one bit inverted at a time, always starting at the least significant bit first and working upwards in bit significance until a code is found which is at least two bits different from all preceding codes except the immediately preceding code; the code found is the next code in the sequence; repeat until no more codes are available in m-bits;

(c) If no new codes are available for m-bits, then increment m and return to (b) to finish generating codes unless the new m is greater than a limit placed on it.

For example if m is limited to 5, the above algorithm generates an m=5-bit Hamming-2 Gray code with 13 states which may be mapped as shown in Table II:

TABLE II

| Decimal | 2's Complement Binary | H2 Gray |
|---|---|---|
| 6 | 0110 | 00000 |
| 5 | 0101 | 00001 |
| 4 | 0100 | 00011 |
| 3 | 0011 | 00111 |
| 2 | 0010 | 00110 |
| 1 | 0001 | 01110 |
| 0 | 0000 | 01100 |
| −1 | 1111 | 01101 |
| −2 | 1110 | 11101 |
| −3 | 1101 | 11111 |
| −4 | 1100 | 11011 |
| −5 | 1011 | 11010 |
| −6 | 1010 | 11000 |

For a single reference pixel Pref then:

$$Gref = \text{BinaryToHamming2Gray}(\text{RoundToNearest}(Pref/T)) \quad (8)$$

A match between a reference pixel and the corresponding search pixel is defined by equations (3)–(6) above. There are fewer bits to deal with after quantization, but then bits are added because of the low coding density of the Hamming-2 Gray code, i.e., 13 codes out of a possible 32 for the example above. If equation (5) is not complied with, then for Hamming-2 Gray code equation (6) is definitely false, as opposed to normal Gray codes which have the probability of a false match.

From equation (6) if:

$$d = (Gref\char`\^ Gsearch) \quad (8)$$

and d(i) is the ith bit of d, and if x(0)=0 and y(0)=0, then the following recurrences may be used:

$$x(n+1) = x(n) | d(n) \quad (9)$$

$$y(n+1) = y(n) | (x(n) \,\&\, d(n)) \quad (10)$$

where "|" is a logical OR operator and "&" is a logical AND operator. Then for m bits in each of Gref and Gsearch, if equation (6) is true, y(m+1)=0, else y(m+1)=1.

If all d(i) for 0=<i<m are zero, than all x(i) are zero from equation (9), and therefore all y(i) are zero from equation (10). If one d(i) is one, then from equation (9) x(j)=1 for all j>i and therefore (x(n) & d(n)) in equation (10) for all 0=<n<m, and y(n+1) is always zero. If two or more bits in d are one, and d(j) is the bit index of the smallest such, then from the recurrence in equation (9) x(j)=1 for all j>i. If any second or more bit d(k)=1 where k>j, then (x(k) & d(k))=1 in equation (10). Therefore y(k+1)=1 and from the recurrence in equation (10) y(r+1)=1 for all r>k, and y(m+1)=1.

As a result tallying the number of y(m+1) values equal to zero in a block provides the quality of fit. The block within the search area with the highest tally has the best fit. Penalty functions in the tally function may be introduced by subtractions from the tally. Penalties may be calculated on the basis of motion distance between the reference block and the corresponding position in the search area, on the basis that large displacements are less likely, or on the basis of the absolute differences between average luminance levels within each block, so preventing matches of blocks with the same features but dramatically different luminance levels.

Figure 2:
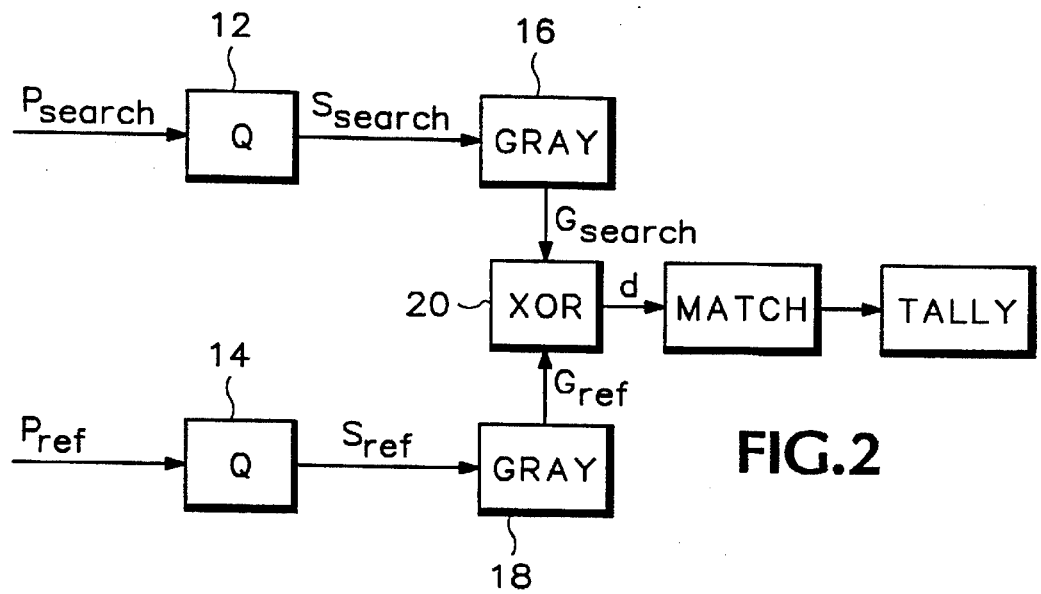
FIG. 2 is a block diagram for block matching according to the present invention.
Figure 3:
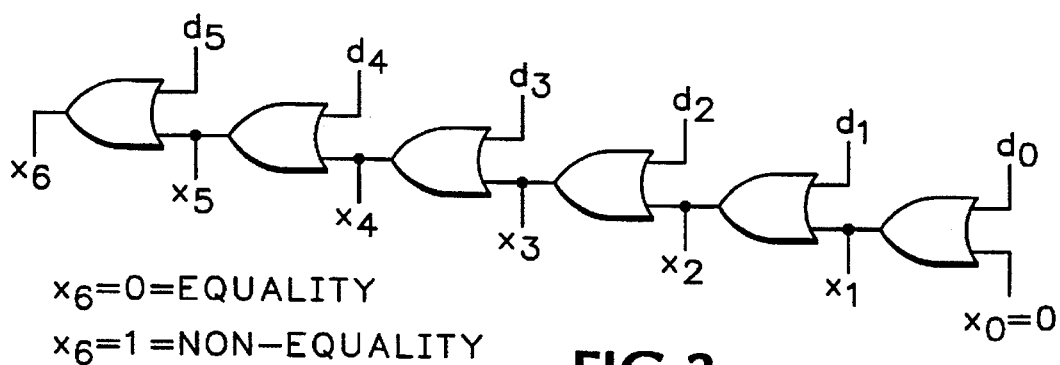
FIG. 3 is a block diagram for a portion of a pixel matching circuit according to the present invention.
Figure 4:
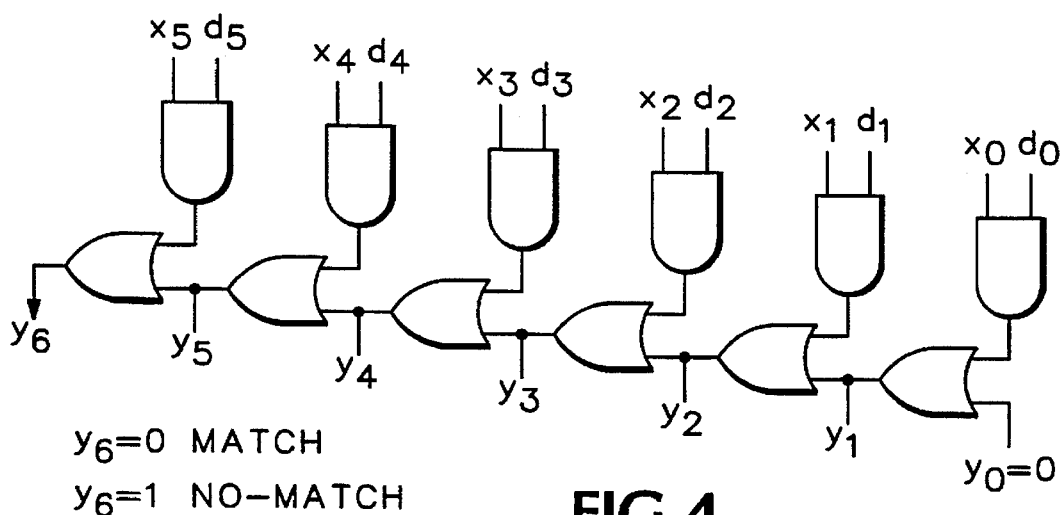
FIG. 4 is a block diagram for the remainder of the pixel matching circuit of FIG. 3 according to the present invention.

Referring now to FIG. 2 search pixel values Psearch are input to a first quantizer 12, while reference pixel values Pref are input to a second quantizer 14. The quantizers perform the quantization process as shown in FIG. 1 where T=5 as an example. Each quantized pixel Sref, Ssearch is input to respective Gray code converters 16, 18, which preferably are Hamming-2 Gray code converters. The resulting Gray coded pixels Gref, Gsearch are input to a bit-wise exclusive OR circuit 20 to produce a match output d. The match output is then input to a comparison circuit as shown in FIGS. 3 and 4. The bits of d are each applied to one input of respective OR gates 22 coupled in series, the output from a preceding one of the OR gates being the other input to the next OR gate. The first OR gate 22 has an initial value x(0) as the other input, and each subsequent OR gate output provides the remaining bits for x. For x(0)=0 each subsequent x(i) is zero until a one-bit for one of the bits of d is found, and all subsequent (higher order) x(i) are one to provide x(6)=1, indicating that at least one bit was different between the two Gray codes Gref, Gsearch.

The d and x words are further compared as shown in FIG. 4 to produce the y word. The corresponding bits of d and x are input to respective AND gates 24. Only if a second bit in the d word also is a one-bit, indicating that the Gray code comparison resulted in two bits of difference, do any of the AND gates 24 produce a "1" output. The outputs of the AND gates 24 are applied each to a first input of respective OR gates 26, the other input of the OR gates being the output from the previous OR gate, with the first OR gate having a y(0) input as the other input. The output from the last OR gate 26 provides a match indicator for tallying. For y(0)=0 so long as there is no second bit difference in d, the output y(6) from the last OR gate 26 is zero, indicating a match. When one of the AND gates 24 provides a "1" output, then all subsequent OR gates 26 pass that "1" to the output, indicating a definitive no match when Hamming-2 Gray code is being used.

Thus the present invention provides block matching for picture motion estimation using Gray codes by quantizing the corresponding pixels of the reference and search blocks, converting the quantized pixels to Gray code, preferably the Hamming-2 Gray code, and then detecting code equality or adjacency to determine a match, which matches are tallied for each reference block position within the search area to provide block matching.

What is claimed is:

1. A method of determining a best fit for block matching for motion estimation comprising the steps of:

quantizing each pixel of a reference block from a first picture frame in a sequence of picture frames and each corresponding pixel in a search area of a next picture frame;

converting the quantized pixels each to a corresponding Gray code;

comparing corresponding pixel values from the reference block and the search area to determine a match if the respective Gray codes are within one of each other;

calculating a tally of the pixel pair matches within the reference block;

repeating the quantizing, converting, comparing and calculating steps for each new position of the reference block within the search area; and identifying a block in the search area corresponding to the reference block which has the largest tally as the best fit.

2. The method as recited in claim 1 wherein the Gray code is a Hamming-2 Gray code having the characteristic that each code value in a sequence differs from an immediately adjacent code value by only one bit from each other with the additional condition that all other code values not immediately adjacent differ by at least two bits.

3. The method as recited in claim 1 wherein the comparing step comprises the steps of:

performing an exclusive OR function between the pixels of each pair to produce a match word; and examining the match word to determine whether there is no more than one bit in the match word having a specified logic state defining the match.

4. An apparatus for determining a best fit for block matching for motion estimation comprising:

means for quantizing each bit of a reference block from a first picture frame of a sequence and of a corresponding portion of a search area from a next picture frame in the sequence;

means for converting the quantized pixel each to a corresponding Gray code;

means for comparing corresponding pixel pairs from the reference block and the search area to determine a match;

means for tallying the number of pixel matches within the reference block to produce a total tally;

means for storing the total tally for each position of the reference block within the search area; and means for identifying a block position in the search area corresponding to the reference block which has the largest tally total.

5. The apparatus as recited in claim 4 wherein the Gray code comprises a Hamming-2 Gray code having each code in a sequence differing by one bit position from each adjacent code in the sequence while differing by at least two bit positions from all other codes in the sequence.

6. The apparatus as recited in claim 4 wherein the comparing means comprises:

means for exclusively ORing each pair of pixels to produce a match word; and means for determining for each match word whether there is no more than one bit position having a specified logic state to define the match.

* * * * *